United States Patent
Roy

(10) Patent No.: US 9,318,496 B2
(45) Date of Patent: Apr. 19, 2016

(54) NONVOLATILE MEMORY DEVICE WITH LAYOUT TO MINIMIZE VOID FORMATION AND METHOD OF MAKING THE SAME

(71) Applicant: Anirban Roy, Austin, TX (US)

(72) Inventor: Anirban Roy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 89 days.

(21) Appl. No.: 14/194,938

(22) Filed: Mar. 3, 2014

(65) Prior Publication Data
US 2015/0249091 A1 Sep. 3, 2015

(51) Int. Cl.
*H01L 27/115* (2006.01)
*H01L 27/02* (2006.01)
*H01L 29/788* (2006.01)

(52) U.S. Cl.
CPC ...... *H01L 27/11521* (2013.01); *H01L 27/0207* (2013.01); *H01L 27/11519* (2013.01); *H01L 29/7881* (2013.01)

(58) Field of Classification Search
None
See application file for complete search history.

(56) References Cited

U.S. PATENT DOCUMENTS

| 7,045,849 | B2 | 5/2006 | Chen et al. | |
|---|---|---|---|---|
| 2005/0037572 | A1* | 2/2005 | Lee | 438/257 |
| 2007/0097777 | A1* | 5/2007 | Sakagami et al. | 365/230.06 |
| 2007/0131979 | A1* | 6/2007 | Fujimoto | 257/244 |
| 2008/0291723 | A1* | 11/2008 | Wang et al. | 365/185.3 |
| 2010/0103744 | A1* | 4/2010 | Yang et al. | 365/185.26 |

OTHER PUBLICATIONS

Kim, N.S., et al., "Successful Fault Isolation of Bit line Leakage and Leakage Suppression by ILD Optimization in Embedded Flash Memory", IEEE, Proceedings of 12th IPFA, Singapore, May 2005, pp. 38-42.
Piazza, F., et al., "High Performance Flash Memory for 65 nm Embedded Automotive Application", IEEE, Jan. 2010, pp. 1-3.

* cited by examiner

*Primary Examiner* — Michael Jung

(57) ABSTRACT

A memory device can include an array of NOR memory cells, each memory cell including a floating gate, a source on a source side of the floating gate, a drain on a drain side of the floating gate, a drain contact on the drain, and a source contact on the source. The source contacts are connected to a common source line. A plurality of bit lines are connected to respective drains in a column of the memory cells. A plurality of word lines, each word line coupled to respective floating gates in a row of the memory cells. Spacing between the word lines on the drain side is greater than spacing between the word lines on the source side.

20 Claims, 2 Drawing Sheets

US 9,318,496 B2

NONVOLATILE MEMORY DEVICE WITH LAYOUT TO MINIMIZE VOID FORMATION AND METHOD OF MAKING THE SAME

BACKGROUND

1. Field

This disclosure relates generally to semiconductor devices, and more specifically, to non-volatile memories (NVMs).

2. Related Art

Non-volatile memories (NVMs) have a significant role in the semiconductor industry in both stand alone and integrated applications. Often NVMs are a significant portion of the size of the overall semiconductor device. Thus much effort is made in minimizing the size of the individual NVM cells that make up the NVM. A significant consideration in this regard is how the cells are laid out together. The integration of the individual NVM cells into an overall NVM array is thus very important. A variety of issues can be relevant to this. The basic row and column structure using orthogonal bit lines and word lines is almost certainly required while also being able to couple power supply terminals to the individual NVM cells as needed for reading, programming, and erasing.

Accordingly there is a need to provide further improvement in avoiding unnecessary usage of space in the arrangement of NVM cells in achieving a NVM array.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an NVM array has common drain connections to common bit lines between adjacent word lines of NVM cells spaced to ensure no void is present through which a conductive material can connect adjacent bit lines. On the other hand, the common source connection between adjacent word lines can tolerate the void because the common source connections between adjacent bit lines can be shorted together. The result is that the spacing between the word lines where the source connections are in common is less than the spacing between word lines where the drain connections are in common and thus saving space for the overall NVM array compared to using the same spacing for these two different situations. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
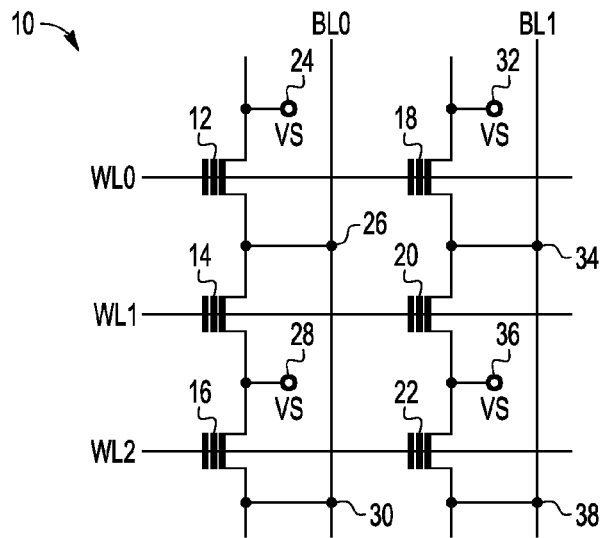
FIG. 1 is a circuit diagram of a portion of a non-volatile memory (NVM) array according to an embodiment.

Shown in FIG. 1 is a portion of an NVM array 10 having NVM cells 12, 14, 16, 18, 20 and 22; word lines WL0, WL1, and WL2; bit lines BL0 and BL1, and contacts 24, 26, 28, 30, 32, 34, 36, and 38. NVM cell 12 and NVM cell 14 each have a drain as part of a common drain region that is connected to bit line BL0 through contact 26. The drains of NVM cells 12 and 14 share a common doped region. NVM cell 14 and NVM cell 16 each have a source connected to a voltage terminal VS through a contact 28. The sources of NVM cells 14 and 16 share a common doped region. NVM cell 16 has a drain connected to bit line BL0 through contact 30. NVM cell 16 shares a drain region with another cell, not shown, that also is connected to bit line BL0. NVM cell 12 has a source connected to voltage terminal VS. NVM cell 18 and NVM cell 20 each have a drain as part of a common drain region that is connected to bit line BL1 through contact 34. The drains of NVM cells 18 and 20 share a common doped region. NVM cell 20 and NVM cell 22 each have a source connected to voltage terminal VS through a contact 36. The sources of NVM cells 20 and 22 share a common doped region. NVM cell 22 has a drain connected to bit line BL1 through contact 38. NVM cell 22 shares a drain region with another cell, not shown, that also is connected to bit line BL1. NVM cell 18 has a source connected to voltage terminal VS. NVM cells 12 and 18 have control gates connected to word line WL0. NVM cells 14 and 20 have control gates connected to word line WL1. NVM cells 16 and 22 have control gates connected to word line WL2. Control gates of NVM cells 12 and 18, in this example, are formed in common with word line WL0. Control gates of NVM cells 14 and 20, in this example, are formed in common with word line WL1. Control gates of NVM cells 16 and 22, in this example, are formed in common with word line WL2. This type of array may be called an array of NOR memory cells. Contacts are for making connections and thus may be called connections. The contacts may be implemented with vias and the vias may be stacked as needed for making connections to overlying metal interconnect lines.

NVM array 10 operates in a well understood manner. In a read, for example, terminal VS is coupled to ground, a selected word line is enabled, and the NVM cells on the enabled word line then couple their logic states to the bit lines to which they are connected. For programming, terminal VS may be coupled to a different voltage than ground. Appropriate voltages are similarly applied to selected bit lines while a selected word line is enabled with a voltage that may be different than that used for a read. NVM array 10 differs structurally, as depicted in FIGS. 2-4, from the prior art.

Figure 2:
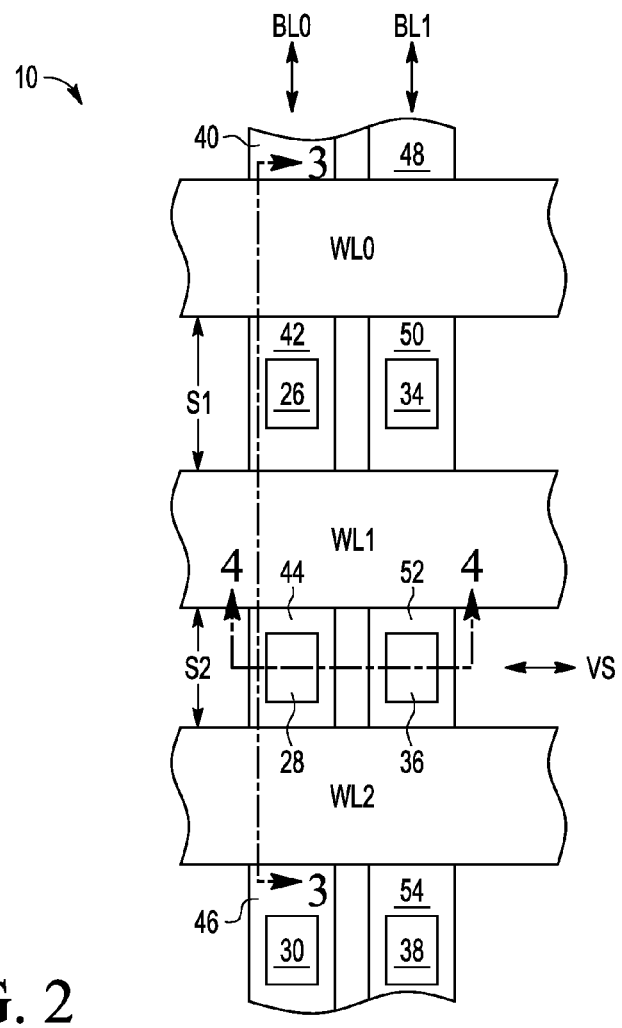
FIG. 2 is a layout of the portion of the NVM of FIG. 1.

As shown in FIG. 2, NVM array 10 has word lines WL0, WL1, and WL2 that run horizontally. Connections 26 and 30, which connect to bit line BL0, are aligned vertically. Similarly, connections 34 and 38, which connect to bit lines BL1, are aligned vertically and may be in a second metal interconnect layer. Connections 28 and 36 are connected to a line that runs horizontally and that is connected to voltage terminal VS and may be in a first metal interconnect layer and pass under bit lines BL0 and BL1. Contacts 26, 30, 34, and 38 make contacts to drain regions 42 for NVM cells 12 and 14, 46 for NVM cell 16, 50 for NVM cells 18 and 20, and 54 for NVM cell 22, respectively. Contacts 28 and 36 make contacts for source region 44 for NVM cells 14 and 16 and source region 52 for NVM cells 20 and 22, respectively. WL0 and WL1 are spaced apart by a distance S1. Word lines WL1 and WL2 are spaced apart by a distance S2 which is less than distance S1. Distance S2 is chosen based on reliably making a contact to the source of the NVM cells. Distance S1 is not only chosen for reliably making a drain contact to NVM cells but also to avoid a damaging short between drains of adjacent NVM cells along a word line.

Figure 3:
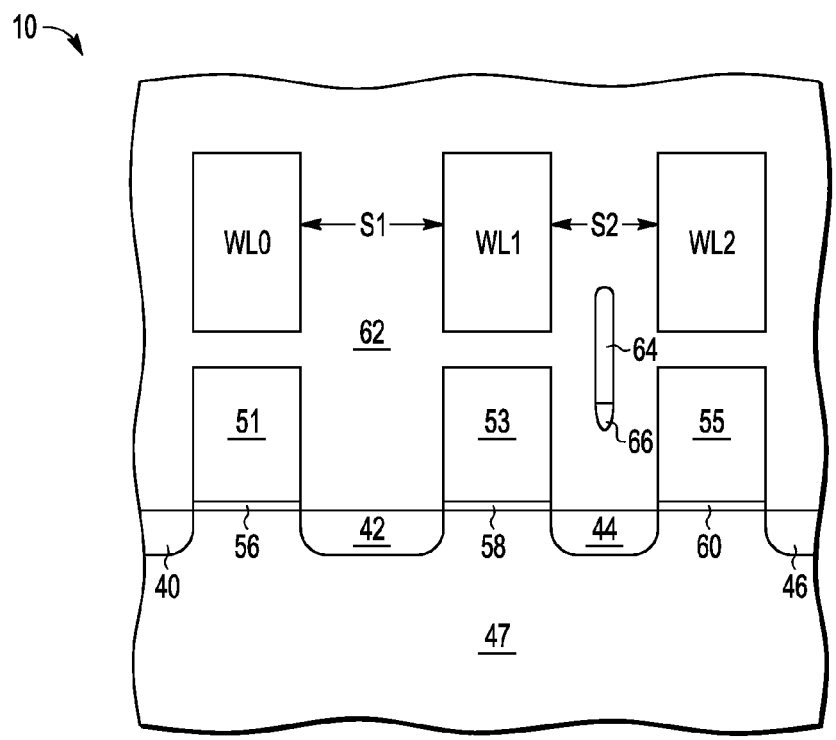
FIG. 3 is a cross section of a first portion of the layout of FIG. 2.
Figure 4:
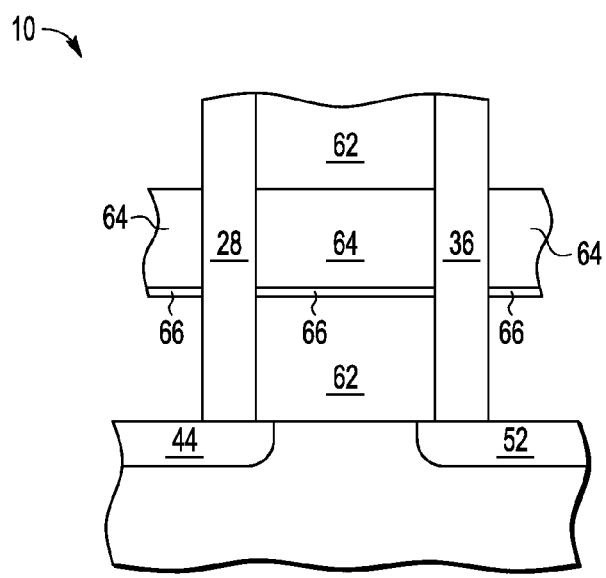
FIG. 4 is a cross section of a second portion of the layout of FIG. 2.

Shown in FIG. 3 is a cross section of NVM array 10 taken at 3-3 shown in FIG. 2 showing floating gates 51, 53, and 55 over a substrate 47. The cross section of FIG. 3 shows floating gate 51 under word line WL0, floating gate 53 under word line WL1, and floating gate 55 under word line WL2. A gate dielectric 56 is between substrate 47 and floating gate 51, a gate dielectric 58 is between substrate 47 and floating gate 53, and a gate dielectric 60 is between substrate 47 and floating gate 55. A dielectric 62 composed of multiple dielectric layers with the result of the floating gates 51, 53, and 55 and word lines WL0, WL1, and WL2 all insulated from each other. Drain region 42 is in substrate 47 and between floating gates 51 and 53, and source region 44 is in substrate 47 between floating gates 53 and 55. Also shown is a void 64 above source 44 in dielectric 62. On a bottom portion of void 64 is a stringer 66 that is formed during the formation of connections 28 and 36. Void 64 may not always form and even if it forms, a stringer, such as stringer 66, may not form. When a void does form and the stringer does form, then there is likely to be a short between adjacent source connections. This is not a problem because the sources are shorted together at voltage terminal VS. The void may occur because floating gates 53 and 55 and word lines WL1 and WL2 are close enough to each other, distance S2, to form the void during the formation of dielectric 62. On the other hand Word lines WL0 and WL1 and floating gates 51 and 53 are spaced far enough apart, distance S1, to ensure that no void forms between word lines WL0 and WL2 or floating gates 51 and 53.

Word line WL0, although not connected to floating gate 51, is coupled to floating gate 51. One example is during programming, the electron flow between substrate 47 and floating gate 51 is influenced by the voltage applied to word line WL0 during programming. Word line WL0 also has an effect on floating gate 51 during erasing and reading.

Shown in FIG. 4 is a cross section of NVM array 10 taken at 4-4 shown in FIG. 2 showing stringer 66 in void 64 contacting both contact 28 and contact 36. The effect of stringer 66 contacting both contact 28 and contact 36 is to short source region 44 to source region 52 and thus shorting the sources of NVM cells 14, 16, 20, and 22.

Although the shorting of sources is harmless because these sources are shorted together anyway, this would result in destroying the reliability of the NVM cells if it were the drains that were shorted. The shorting of the drains is avoided by having the sufficient spacing of distance S1 between word lines where the drains are present. In practice, if the void forms and a stringer is formed within the void, the void and resulting stringer will likely extend the length of the word lines WL1 and WL2 row and thereby destroy the reliability of all of the cells along the word lines if the void and resulting stringer are over the drain regions. Where the voids are harmless, which is over the source regions, the word lines are spaced closer together to reduce the overall area of the NVM array while keeping the spacing between word lines greater where it is necessary to do so. One example of a difference between S1 and S2 is that the ratio of the width of the drain contact to spacing between the floating gates on the drain side is less than a ratio of width of the source contact to spacing between the floating gates on the source side. Another example is that S1 is 15 to 25 percent greater than S2.

By now it should be appreciated that there has been provided a memory device an array of NOR memory cells. Each memory cell includes a floating gate, a source on a source side of the floating gate, a drain on a drain side of the floating gate, a drain contact on the drain, and a source contact on the source. The source contacts are connected to a common source line. The memory further includes a plurality of bit lines, each bit line connecting each of the drains in a column of the memory cells. The memory further includes a plurality of word lines. Each word line is coupled to the floating gates in a row of the memory cells. The spacing between the word lines on the drain side is greater than spacing between the word lines on the source side. The memory may further include a dielectric material between the floating gates and the word lines. The memory may further include a gate dielectric between the floating gates and a substrate. The memory may have a further characterization by which spacing between the floating gates on the drain side is greater than spacing between the floating gates on the source side. The memory may have a further characterization by which a ratio of width of the drain contact to spacing between the floating gates on the drain side is less than a ratio of width of the source contact to spacing between the floating gates on the source side. The memory may have a further characterization by which one of the sources is shared by a first and second of the floating gates and one of the drains is shared by the second and a third of the floating gates. The memory may have a further characterization by which the spacing on the drain side is 15 to 25 percent greater than the spacing on the source side.

Also disclosed is a memory device having a a first NOR memory cell having a first source, a first drain, a first floating gate, a conductive contact on the first source, and a conductive contact on the first drain. The memory device further includes a second NOR memory cell arranged in a column with the first NOR memory cell and having the first source in common with the first NOR memory cell, a second drain, a second floating gate, a conductive contact on the second drain. The memory device further includes a third NOR memory cell arranged in a column with the first and second NOR memory cells and having a second source, the second drain in common with the second NOR memory cell, a third floating gate, and a conductive contact on the second source. The memory device has a further characterization by which a first spacing between the first and second floating gates is less than a second spacing between the second and third floating gates. The memory device may further include a first bit line coupled to the first and second drains. The memory device may further include a first word line coupled to the floating gate of the first NOR memory cell, a second word line coupled to the floating gate of the second NOR memory cell, and a third word line coupled to the floating gate of the third NOR memory cell. The memory may have a further characterization by which a distance between the second and third floating gates adjacent the second drain is 15 to 25 percent greater than a distance between the first and second floating gates adjacent the first source. The memory may have a further characterization by which the first and second sources are coupled to a common source line. The memory device may further include a dielectric material between the first, second and third floating gates and the word lines. The memory device may further include a gate dielectric between the first, second and third floating gates and a substrate. The memory may have a further characterization by which a ratio of width of the conductive contact on the first drain to spacing between the second and third floating gates is less than a ratio of width of the conductive contact on the first source to spacing between the first and second floating gates.

Disclosed also is a method of making a memory device including forming a first NOR memory cell having a first source, a first drain, a first floating gate, a conductive contact on the first source, and a conductive contact on the first drain. The method further includes forming a second NOR memory cell arranged in a column with the first NOR memory cell and having the first source in common with the first NOR memory cell, a second drain, a second floating gate, and a conductive contact on the second drain. The method further includes forming a third NOR memory cell arranged in a column with the first and second NOR memory cells and having a second source, the second drain in common with the second NOR memory cell, a third floating gate, and a conductive contact on the second source. The method further includes forming a first word line coupled to the floating gate of the first NOR memory cell. The method further includes forming a second word line coupled to the floating gate of the second NOR memory cell. The method further includes forming a third word line coupled to the floating gate of the third NOR memory cell. The method has a further characterization by which a first spacing between the first and second word lines is less than a second spacing between the second and third word lines. The method may further include forming a first bit line coupled to the first and second drains. The method may have a further characterization by which a distance between the second and third floating gates adjacent the second drain is 15 to 25 percent greater than a distance between the first and second floating gates adjacent the first source. The method may further include forming a common source line coupled to the first and second sources.

Although the invention is described herein with reference to specific embodiments, various modifications and changes can be made without departing from the scope of the present invention as set forth in the claims below. For example, the particular implementation of difference in word line spacing may differ from the examples provided. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory device, comprising:
    an array of NOR memory cells, each NOR memory cell including a floating gate, a source on a source side of the floating gate, a drain on a drain side of the floating gate, a drain contact on the drain, and a discrete source contact on the source, wherein the source contact is connected to a common source line;
    bit lines, each bit line connecting each of the drains in a column of the NOR memory cells; and
    word lines, each word line coupled to each of the floating gates in a row of the NOR memory cells, wherein spacing between one of the word lines on the drain side is greater than spacing between one of the word lines on the source side.

2. The memory device of claim 1, further comprising a dielectric material between the floating gates and each of the word lines.

3. The memory device of claim 1, further comprising a gate dielectric between the floating gates and a substrate.

4. The memory device of claim 1, wherein each of the NOR memory cells includes space between the floating gate on the drain side is greater than spacing between the floating gate on the source side.

5. The memory device of claim 1, wherein a width and a height of the drain contact is the same as a width and a height of the source contact.

6. The memory device of claim 1, wherein the common source line is coupled to ground.

7. The memory device of claim 1, wherein one of the sources is shared by a first and second of the floating gates and one of the drains is shared by the second and a third of the floating gates.

8. The memory device of claim 1, wherein the spacing on the drain side is 15 to 25 percent greater than the spacing on the source side.

9. A memory device comprising:
    a first NOR memory cell having a first source, a first drain, a first floating gate, a separate conductive contact on the first source, and a conductive contact on the first drain;
    a second NOR memory cell arranged in a column with the first NOR memory cell and having the first source and the separate conductive contact on the first source in common with the first NOR memory cell, a second drain, a second floating gate, a conductive contact on the second drain; and
    a third NOR memory cell arranged in a column with the first and second NOR memory cells and having a second source, the second drain in common with the second NOR memory cell, a third floating gate, and a separate conductive contact on the second source;
    a fourth NOR memory cell arranged in a row with the first NOR memory cell and having a third source, a separate conductive contact on the third source, a third drain, a fourth floating gate, and a conductive contact on the third drain;
    wherein a first spacing between the first and second floating gates is less than a second spacing between the second and third floating gates.

10. The memory device of claim 9, further comprising:
    a first bit line coupled to the first and second drains.

11. The memory device of claim 9, further comprising:
    a first word line coupled to the floating gate of the first NOR memory cell;
    a second word line coupled to the floating gate of the second NOR memory cell; and
    a third word line coupled to the floating gate of the third NOR memory cell.

12. The memory device of claim 9, wherein a distance between the second and third floating gates adjacent the second drain is 15 to 25 percent greater than a distance between the first and second floating gates adjacent the first source.

13. The memory device of claim 9, wherein the first and second sources are coupled to a common source line.

14. The memory device of claim 9, further comprising a dielectric material between the first, second and third floating gates and the word lines.

15. The memory device of claim 9, further comprising a gate dielectric between the first, second and third floating gates and a substrate.

16. The memory device of claim 9, wherein a ratio of width of the conductive contact on the first drain to spacing between the second and third floating gates is less than a ratio of width of the separate conductive contact on the first source to spacing between the first and second floating gates.

17. A method of making a memory device comprising:
- forming a first NOR memory cell having a first source, a first drain, a first floating gate, a discrete conductive contact on the first source, and a conductive contact on the first drain;
- forming a second NOR memory cell arranged in a column with the first NOR memory cell and having the first source and the discrete conductive contact on the first source in common with the first NOR memory cell, a second drain, a second floating gate, a conductive contact on the second drain;
- forming a third NOR memory cell arranged in a column with the first and second NOR memory cells and having a second source, the second drain in common with the second NOR memory cell, a third floating gate, and a discrete conductive contact on the second source;
- forming a fourth NOR memory cell arranged in a row with the first NOR memory cell and having a third source, a discrete conductive contact on the third source, a third drain, a fourth floating gate, and a conductive contact on the third drain;
- forming a first word line coupled to the floating gate of the first NOR memory cell;
- forming a second word line coupled to the floating gate of the second NOR memory cell; and
- forming a third word line coupled to the floating gate of the third NOR memory cell,
- wherein a first spacing between the first and second word lines is less than a second spacing between the second and third word lines.

18. The method of claim 17, further comprising:
- forming a first bit line coupled to the first and second drains.

19. The method of claim 17, wherein a distance between the second and third floating gates adjacent the second drain is 15 to 25 percent greater than a distance between the first and second floating gates adjacent the first source.

20. The method of claim 17, further comprising forming a common source line coupled to the first and second sources.

* * * * *